United States Patent [19]

Juhasz

[11] 4,104,580

[45] Aug. 1, 1978

[54] STORAGE BATTERY TEST APPARATUS TO DETERMINE REMAINING STORED CHARGE THEREIN

[75] Inventor: Josef Juhasz, Möglingen, Germany

[73] Assignee: Robert Bosch GmbH, Stuttgart, Germany

[21] Appl. No.: 727,951

[22] Filed: Sep. 28, 1976

[30] Foreign Application Priority Data

Oct. 8, 1975 [DE] Fed. Rep. of Germany ....... 2545086

[51] Int. Cl.² ........................................... G01N 27/42
[52] U.S. Cl. ................... 324/29.5; 324/131; 324/141; 324/157
[58] Field of Search ...................... 324/29.5, 133, 157, 324/182, 62, 141, 131; 320/9, 13, 21, 29, 32, 39, 43, 44, 48; 340/266

[56] References Cited

U.S. PATENT DOCUMENTS

| 2,314,244 | 3/1943 | Pratt | 324/141 |
| 2,431,992 | 12/1947 | Dalzell | 324/29.5 |
| 3,969,667 | 7/1976 | McWilliams | 324/29.5 |
| 4,021,718 | 5/1977 | Konrad | 324/29.5 |

*Primary Examiner*—M. Tokar
*Attorney, Agent, or Firm*—Flynn & Frishauf

[57] ABSTRACT

A volt meter is connected across the battery terminals to read output voltage; a standard load, which may be the normally connected or design load for the storage battery is connected thereacross and, when a predetermined load current flows into the standard load, a control means coupled to the volt meter controls the volt meter to then indicate battery voltage as a measure of remaining stored charge.

7 Claims, 4 Drawing Figures

STORAGE BATTERY TEST APPARATUS TO DETERMINE REMAINING STORED CHARGE THEREIN

The present invention relates to a test apparatus and system to test secondary batteries, or storage batteries, and particularly to determine the remaining stored charge in storage batteries used in electrical vehicles by using a volt meter connected across the terminals of the storage battery.

It has previously been proposed to measure the voltage across the battery terminals and simulating the internal resistance of the battery by an outside shunt to compensate voltage drop across the actual internal resistance of the battery. This system and testing method has the disadvantage that the internal battery resistance is not of constant, invarying value and that the shunt resistance to simulate the internal resistance of the battery has to be recalibrated from time to time, since otherwise, the voltage measured across the volt meter is no longer sufficiently accurate, that is, representative of the charged state of the battery.

It is an object of the present invention to provide an apparatus and system to test storage batteries and particularly to determine the still remaining charge in the battery, and more particularly, to determine the charged state of batteries used with electrical vehicles, and which are more accurate and do not have the disadvantages aforementioned. The apparatus should be simple in use, and require only a single setting for a typical load current so that in subsequent testing steps or test cycles, the correct measuring value will always be indicated, the apparatus and system also considering changes of the actual internal resistance of the battery inherently, and automatically.

SUBJECT MATTER OF THE PRESENT INVENTION

Briefly, a standard load is connected to the battery, which may be the load to which the battery is normally connected; an am-meter measures current flowing through the load and control means are provided sensing when a predetermined current flows into the standard load, and, when such current occurs, an indicator is released, or triggered, to indicate voltage of the battery at that time, as representative of the remaining stored charge in the battery.

The invention will be described by way of example with reference to the accompanying drawings wherein.

Figure 1:
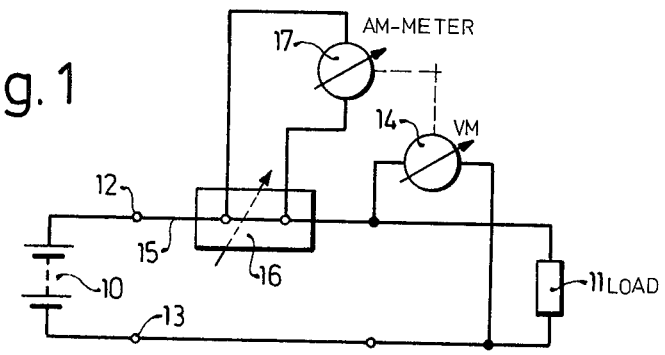
FIG. 1 is a general, principal schematic circuit diagram to show the arrangement to test storage batteries.

The purpose of the system and apparatus is to test the storage battery 10 (FIG. 1) or more particularly, to determine its remaining charged state. The output terminals 12, 13 of the battery are connected to a load 11. This load 11 may be a resistor, or, if the battery is to be used with electrical vehicles, it may be the drive motor of the vehicle itself. A volt meter 14 is connected across the terminals 12, 13 of the battery 10, which determines the battery output voltage, or, respectively, the voltage across load 11. One of the supply lines to the load 11, in FIG. 1 supply line 15, has a meter-shunt resistor 16 connected in series therewith, to which an instrument 17 is connected. Shunt 16 and meter 17 together form an am-meter to determine a typical design or standard load current. When that particular design or standard load current flows — as indicated in am-meter 17 — the volt meter 14 is released, or triggered, to indicate the then existing voltage. This then existing voltage provides a reliable indication of the remaining charge in the battery 10.

Figure 2:
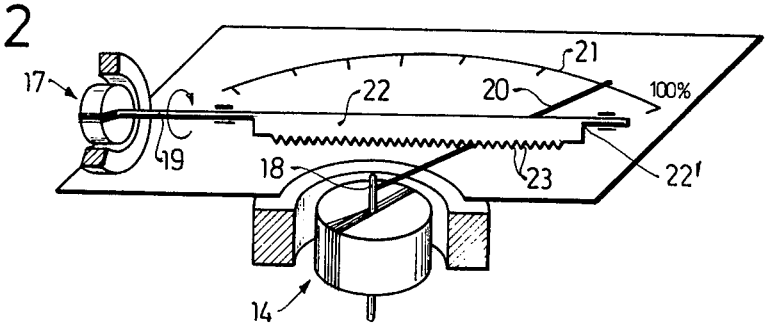
FIG. 2 is a perspective view of a structural embodiment having two moving coil instruments.

An apparatus to carry out this measurement and to provide a direct remaining charge indication by means of a scale which can be calibrated in units of, for example, hours of operation at rated, design load current, is shown in FIG. 2. Volt metter 14 and am-meter instrument 17 are each formed as a moving coil instrument. The axes of rotation 18, 19 of the respective moving coil instruments are located at right angles to each other. The volt meter unit 14 has an indicator 20 which moves over a scale 21. The current measuring instrument 17 is formed with an edge 22 connected to its shaft 19. Knife edge 22 has a plurality of notches 23, to form a serrated edge.

Operation and test measurement: Upon connection of volt meter 14 to the battery 10, still open circuited, a volt meter 14 will indicate a certain open-circuit voltage. Knife edge 23 is rotated, for example, manually, to permit the volt meter needle 20 to deflect as far as it will go under the then existing open circuit voltage connections; or the serrated edge 22 can be so arranged that, under open-circuit conditions, the edge 22 just clears the needle 20. Upon closing of the battery circuit by connecting a load, the shaft 19 of the am-meter 17 will rotate, or the shaft will already be in a position in which the edge 22 with its notches 23 holds needle 20 of the volt meter 14 in a rested position; that will be the position which the needle 20 of volt meter 14 had when the edge 22 has last released the needle 20 for free movement. The edge 22 is set with respect to the saft 19 and the instrument 17 in such an angle of position that when the design load current flows into load 11 — that is, when load 11 has a predetermined design or calibrating value — rotation of shaft 19 will have reached such a point that the edge 22 will release needle or pointer 20 of the volt meter 14. Thus, volt meter 14 is released at precisely the point when the load has its calibrated design value, or rather, when a predetermined calibrating load current flows. The then existing battery terminal voltage will be indicative of the remaining stored electrical power in the battery. If the load current then is increased, for example, by decreasing the resistance of load 11 beyond that of the "test" value, no further stopping of the needle 20 by the knife edge 22 will occur; the needle 20 will drop, indicating a drop in terminal voltage of the battery. The extent of the drop, with respect to the extent of increase of load current can be used to determine the condition of the battery. It is, of course, readily possible to place a second knife edge 22 on the shaft 19 so arranged that, when a second test current flows, the indicator 20 is locked in a second position. The difference in indication between the battery terminal voltage under standard test current conditions and the battery terminal voltage at a second and increased test current then will give further information relating to the condition of the battery and its ability to hold a charge.

The arrangement as described releases the indicator 20 after a deflected value representative of a lower than test current had been stored and, if the indicator shaft 19 carries a second knife edge 22' after a lower deflected current has been stored, to release the pointer only when the test or design load current flows. Upon later flow of this second and design load current, knife edge 22 is again rotated to the released position, releasing the indicator 20 to provide a further output reading. The indicator, therefore, can be used sequentially, in time, to indicate at various times, and after use, the still remaining stored electrical power in the battery.

Preferably, a manual release is provided for the indicator 20 to release volt meter 14 for indication, and to measure output voltage at any given time, as desired.

Figure 3:
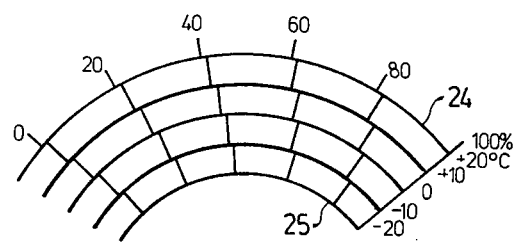
FIG. 3 is a schematic scale for the structure of FIG. 2.

The scale of FIG. 3 shows typical divisions which can be arranged on meter 14, calibrated in percent of remaining charge, and allowing for variations in charge capacity due to temperature variations. Scale 21 (FIG. 2) then is formed as shown in FIG. 3 in which a single point or deflection, indicates a remaining charge state which varies with ambient temperature. The scale of FIG. 3 has a plurality of subdivisions allocated to various temperatures; for example, upper scale 24 (FIG. 3) is applicable at an ambient temperature of +20° C, the lower scale 25 (FIG. 3) being applicable to a temperature of −20° C. The intermediate temperature ranges are indicated. At ambient intermediate temperatures, a visual interpolation can be readily effected.

Figure 4:
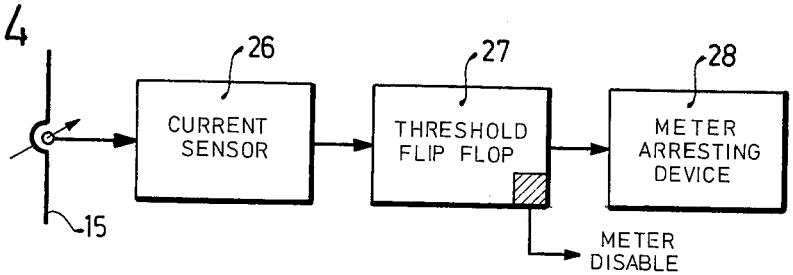
FIG. 4 is a block diagram of an electronic arrangement to effect voltage measurement at a given time, that is to stop and store a measurement at a certain condition.

FIG. 4 indicates, in block diagram form, an electromechanical or electrical system to release the volt meter 14 of FIG. 1. A current flow sensor 26 is connected in the conductor 15, similar to shunt 16. When a predetermined current flows, or current flow within a predetermined range occurs, a representative signal is applied to a trigger circuit 27 which, for example, is an electronic flip-flop. The current sensor, in the most simple form, can be a calibrating resistor. When the voltage drop across the calibrating resistor reaches a predetermined value, flip-flop (FF) 27 is triggered to then provide an oututpe signal to a meter arresting device 28 coupled to the indicator of the volt meter 14. Contrary to the operation of the system of FIG. 2, therefore, the indicator 20 is arrested when the predetermined current is sensed, being free to move under different current conditions. A simple meter arresting device is, for example, a pull-down magnet, extending across the deflection range of the indicator 20 and being energized by flip-flop 27 at selected times to pull the pointer 20 against the face of the scale to be held there by friction. The current sensor and flip-flop 27 can be additionally connected to the meter so that, under normal conditions, the meter reads 0 or is arrested at a limit position and is released to indicate battery voltage on a scale only at the time when the design, or test current flows, is sensed by current sensor 26. When the current is smaller, or greater, the meter 14 is disabled. Such an output can be taken, for example, from an inverting output from flip-flop 27 over line 27'.

The arrangement of FIG. 4 has the specific advantage in that the meter arresting device 28 uses power to release the meter arresting device only when the test current is actually flowing, that does not require any power to arrest or stop the needle at other than test current values.

The calibrating resistor, preferably, is so dimensioned that it provides a voltage drop thereacross which can readily be indicated on a simple meter 14 when a typical load current flows.

Various changes and modifications may be made; for example, the spring in the measuring instrument 14 or a brake in the instrument 17 can be used to cause an indication from volt meter 14 only at a certain test load current, or load current range, when a predetermined and typical, or average, load current flows from battery 10 to the load 11.

The indication need not be done visually by an analog instrument as shown in FIG. 2, or by releasing, or arresting, respectively, a meter by the sysem of FIG. 4. The output can be obtained either digitally, or otherwise visually; volt meter 14 can be re-energized, or released by a relay which is current sensitive and which replaces the am-meter 17, the relay releasing or arresting, respectively, the pointer 20 of the volt meter 14 when the calibrating or typical current flows.

The apparatus and system is characterized by simplicity and permits testing of storage batteries to determine the remaining charge therein. The use is not restricted to electrical vehicles; automotive batteries, likewise, can be treated therewith. Battery voltage is measured, for example, when the starter is operated, which provides a typical high load, at which the battery voltage provides a good output indication from which the charged state of the battery can be determined. Additionally, by checking the drop in battery voltage upon continued operation of the starter, the condition of the battery — that is, its capability to hold a charge — can be determined; thus, a simple instrument can give an indication whether the battery is still in order, or should be replaced.

The remaining storage capacity of the battery, in accordance with the system and apparatus, is therefore measured by determining the remaining capacity independently of changes in internal resistance of the battery; thus, the remaining charged state of a battery can be determined independently of the then existing age or condition of the storage battery.

I claim:

1. Storage battery test apparatus to determine the remaining storage capacity of the battery (10) comprising a volt meter (14) having a needle (20) and voltage connection means to connect said volt meter across the battery terminals (12, 13);

a standard load (11) and power connection means (15) to connect the standard load across the battery terminals (12, 13);

a current sensing means (16, 17) including an ammeter (17) and current connection means to connect the current sensing means into the power connection means and hence into the battery — standard load circuit, and a meter arresting device (22, 22', 23) mechanically coupled to the volt meter (14) and controlled by the ammeter to arrest movement of the volt meter needle (20) under current sensing conditions of current flow other than current flow at a predetermined test current range, the ammeter sensing when a predetermined current flows from the battery (10) to the standard load, and controlling the volt meter to then provide an output indication which will be representative of the remaining charge stored in the battery.

2. Apparatus according to claim 1 wherein the meter arresting device (22, 22', 23; 27) coupled to the volt meter arrests the volt meter indicator when said predetermined load current, is exceeded, to hold the volt meter indicator at its last position at which said predetermined current was flowing, in said predetermined current flow range.

3. Apparatus according to claim 1 wherein the am-meter comprises a movable coil instrument (17) with a shaft (19) having an axis of rotation transverse to the axis of rotation of the shaft (18) of the volt meter (14) and the meter arresting device includes at least one rotatable edge (22) engageable with the pointer or indicator (20) of the volt meter (14), the edge having a rotary position with respect to the shaft of the am-meter (17) to release engagement of the edge with the indicator (20) when the am-meter is rotated under influence of current flow at the predetermined test value range, the edge arresting movement of the pointer or indicator (20) of the volt meter at other conditions of the rotation of the shaft of the am-meter.

4. Apparatus according to claim 3 wherein the edge (20) coupled to the shaft (19) of the am-meter (17) is serrated to reliably arrest movement of the pointer or indicator (20) of the volt meter.

5. Apparatus according to claim 1 wherein the current sensing means (16, 17, 27) comprises a shunt resistor (16) of adjustable value connected in series circuit relation between the battery (10) and the load (11),
 to permit matching of the apparatus to predetermined load current ranges for different batteries, or battery arrays.

6. Apparatus according to claim 1 wherein the volt meter has a scale calibrated in percent of remaining charge in the battery.

7. Apparatus according to claim 6 wherein the scale is subdivided to indicate percent of remaining charge in the battery at respectively different ambient temperature conditions.

* * * * *